US012738457B2

(12) United States Patent
Moalem

(10) Patent No.: US 12,738,457 B2
(45) Date of Patent: Sep. 15, 2026

(54) REMOTE PLASMA APPARATUS FOR GENERATING HIGH-POWER DENSITY MICROWAVE PLASMA

(71) Applicant: Applied Materials, Inc., Santa Clara, CA (US)

(72) Inventor: Mehran Moalem, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 512 days.

(21) Appl. No.: 17/835,718

(22) Filed: Jun. 8, 2022

(65) Prior Publication Data

US 2022/0415617 A1 Dec. 29, 2022

Related U.S. Application Data

(60) Provisional application No. 63/215,370, filed on Jun. 25, 2021.

(51) Int. Cl.
*H01J 37/32* (2006.01)

(52) U.S. Cl.
CPC .... *H01J 37/32357* (2013.01); *H01J 37/3244* (2013.01); *H01J 37/32522* (2013.01); *H01J 37/32862* (2013.01); *H01J 2237/332* (2013.01)

(58) Field of Classification Search
CPC ................................................ H01J 37/32357
See application file for complete search history.

(56) References Cited

U.S. PATENT DOCUMENTS

2003/0148623 A1* 8/2003 Ohmi .................. H01J 37/3222 438/709
2006/0137613 A1* 6/2006 Kasai ................ H01J 37/32192 118/723 ME
2007/0144671 A1* 6/2007 Ohmi ................ C23C 16/45565 156/345.33
2009/0133713 A1* 5/2009 Ohmi ........................ C23C 4/02 428/323
2009/0159214 A1* 6/2009 Kasai ................ H01J 37/32192 422/186.04
2014/0102367 A1* 4/2014 Ishibashi ........... H01J 37/32229 118/723 ME
2018/0323043 A1* 11/2018 Kraus ............... H01J 37/32238
2018/0342374 A1* 11/2018 Liang .................. H01J 37/3244
2018/0342379 A1* 11/2018 Jurczyk ............. H01J 37/32449
2019/0326098 A1* 10/2019 Nguyen ............. H01J 37/32311

* cited by examiner

*Primary Examiner* — Keath T Chen
(74) *Attorney, Agent, or Firm* — Schwabe, Williamson & Wyatt, P.C.

(57) ABSTRACT

Embodiments disclosed herein include a plasma source. In an embodiment, a plasma source comprises a dielectric body with a top surface, a bottom surface, and sidewall surfaces. In an embodiment, a plurality of holes pass through the dielectric body, where a first set of holes pass from the top surface to the bottom surface, and a second set of holes pass between opposite sidewall surfaces. In an embodiment, a housing is around the dielectric body, and a monopole antenna extending into the dielectric body.

20 Claims, 7 Drawing Sheets

REMOTE PLASMA APPARATUS FOR GENERATING HIGH-POWER DENSITY MICROWAVE PLASMA

CROSS-REFERENCE TO RELATED APPLICATIONS

This application claims the benefit of U.S. Provisional Application No. 63/215,370, filed on Jun. 25, 2021, the entire contents of which are hereby incorporated by reference herein.

BACKGROUND

1) Field

Embodiments of the present disclosure pertain to the field of semiconductor processing and, in particular, to remote plasma systems for generating high-power and density microwave plasmas.

2) Description of Related Art

Semiconductor deposition systems require frequent chamber cleaning to clear buildup of material on the chamber walls. The most efficient process typically used includes an $NF_3$ remote plasma clean. In such cleaning processes, the $NF_3$ is broken down in the plasma to generate atomic fluorine. The atomic fluorine flows from the remote plasma source to the chamber. Atomic fluorine is highly reactive and reacts with the material deposited on the chamber walls to form a volatile product that can be removed through a vacuum exhaust system.

Typically, such remote plasma cleaning processes require high power and high flow rates of the $NF_3$ due to low utilization rates. Accordingly, the process can be expensive and wasteful. Additionally, microwave plasma sources are typically bulky and result in the remote chamber being more physically distant from the processing chamber.

Remote plasma sources are also used for deposition and etch applications where radicals generated by the remote plasma source are used in processing semiconductor wafers. Again, high efficiency processes will assist in higher utilization of input gas and result in a more efficient and faster process.

SUMMARY

Embodiments disclosed herein include a plasma source. In an embodiment, a plasma source comprises a dielectric body with a top surface, a bottom surface, and sidewall surfaces. In an embodiment, a plurality of holes pass through the dielectric body, where a first set of holes pass from the top surface to the bottom surface, and a second set of holes pass between opposite sidewall surfaces. In an embodiment, a housing is around the dielectric body, and a monopole antenna extending into the dielectric body.

In an additional embodiment, a plasma processing tool comprises, a chamber, where the chamber is fluidically coupled to a pump that is configured to provide a sub-atmospheric pressure in the chamber, and a plasma source coupled to the chamber. In an embodiment, the plasma source comprises a dielectric body with a top surface, a bottom surface, and sidewall surfaces, and a plurality of holes through the dielectric body, where a first set of holes pass from the top surface to the bottom surface, and a second set of holes pass between opposite sidewall surfaces. In an embodiment, the plasma source may further comprise a housing around the dielectric body, and a monopole antenna extending into the dielectric body.

In yet another embodiment, a plasma processing tool comprises a chamber, where the chamber is fluidically coupled to a pump configured to provide a sub-atmospheric pressure in the chamber, and a remote plasma source coupled to the chamber. In an embodiment, the remote plasma source comprises a dielectric body and a plurality of holes passing through the dielectric body. In an embodiment, two or more of the plurality of holes intersect each other at a substantially orthogonal angle. In an embodiment, a monopole antenna extends into the dielectric body through an antenna hole, where the antenna hole does not intersect any of the plurality of holes.

DETAILED DESCRIPTION

Remote plasma systems for generating high-power and density microwave plasmas are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects, such as integrated circuit fabrication, are not described in detail in order to not unnecessarily obscure embodiments of the present disclosure. Furthermore, it is to be understood that the various embodiments shown in the Figures are illustrative representations and are not necessarily drawn to scale.

As noted above, plasma cleaning processes typically utilize remote plasma systems. However, existing systems are limited in gas utilization efficiency and require high power to achieve a desired gas breakdown efficiency. Accordingly, embodiments disclosed herein include remote plasma sources that have improved gas utilization efficiency and require lower power for the same breakdown efficiency. Additionally, embodiments disclosed herein require a much smaller footprint, and enables closer and better placement of the plasma source relative to the process chamber.

Particularly, embodiments disclosed herein combine the resonator and reactor chambers to minimize plasma volume and maximize breakdown efficiency of source gases (e.g., $NF_3$). For example, a grounded reactor chamber may surround a dielectric body that is used as the resonator. Holes may be provided through the dielectric body to provide space to form the plasma. That is, the plasma may be generated inside the resonator. The holes may be oriented to allow for the flow of gasses from a top surface of the dielectric body to a bottom surface of the dielectric body. A monopole antenna inserted into an isolated hole into the dielectric body may excite the plasma within the dielectric body, and dissociated gasses may flow out the bottom surface of the dielectric body to the main processing chamber.

Figure 1:
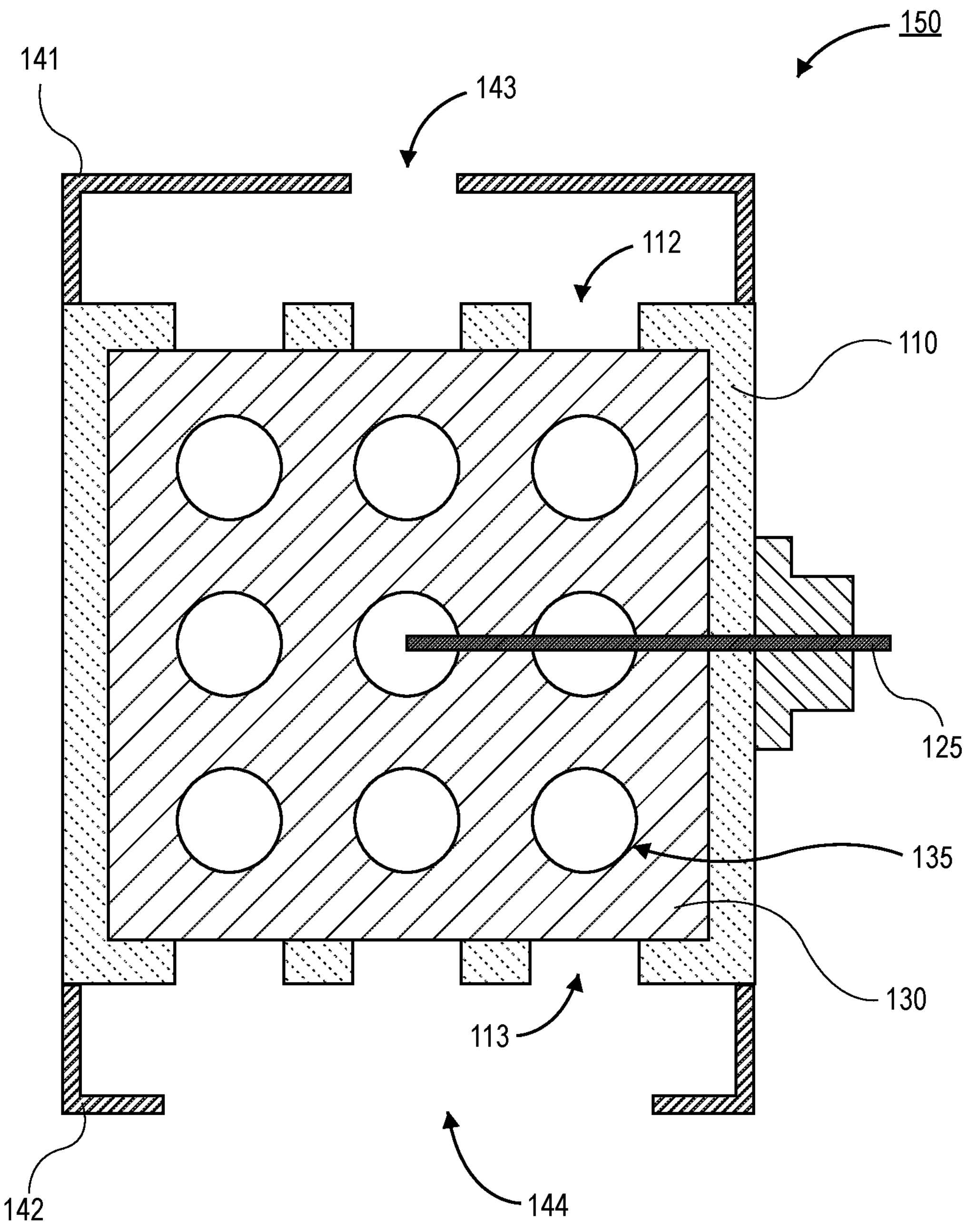
FIG. 1 is a front view illustration of a plasma source with a dielectric body with holes through the dielectric body, in accordance with an embodiment.

Referring now to FIG. 1, a cross-sectional illustration of a plasma source 150 is shown, in accordance with an embodiment. In an embodiment, the plasma source 150 comprises a housing 110 that surrounds a dielectric body 130. The housing 110 may be a conductive material such as, but not limited to, aluminum. The housing 110 may be grounded in some embodiments. In an embodiment, the dielectric body 130 may be any suitable dielectric material. In a particular embodiment, the dielectric body 130 is a ceramic, such as, but not limited to alumina. In the illustrated embodiment, the housing 110 is shown as a single monolithic structure. However, in other embodiments, top and bottom sides of the housing 110 may be removable and attached to the vertical walls of the housing 110 by elastomer seals, or the like.

In an embodiment, holes 135 may be provided through the dielectric body 130. The holes shown in FIG. 1 are oriented from the front of the dielectric body 130 to the back of the dielectric body 130. It is to be appreciated that additional holes may be provided between the top surface and the bottom surface of the dielectric body 130, and between sidewall surfaces of the dielectric body 130. These additional holes are omitted in the interest of clarity in FIG. 1. A monopole antenna 125 is also shown as being inserted into a sidewall of the dielectric body 130. While shown as intersection a pair of holes 135, it is to be appreciated that the monopole antenna 125 may be inserted into an isolated hole 135, as will be described in greater detail below.

In an embodiment, a first chamber 141 is above the housing 110, and a second chamber 142 is below the housing 110. The first chamber 141 may have an inlet 143 to receive gasses from a gas source. In the case of a plasma cleaning operation, the gas may comprise $NF_3$. Though, it is to be appreciated that any gas can be flown into the first chamber 141. That is, the plasma source 150 is not limited to being a plasma source for a cleaning operation. In an embodiment, the second chamber 142 has an outlet 144 that fluidically couples to a processing chamber (not shown in FIG. 1). In an embodiment, dissociated gas flows out the bottom of the housing 110, into the second chamber 141 and, eventually, into the processing chamber. In an embodiment, gasses may flow into the dielectric body 130 through openings 112 in the housing 110. Dissociated gasses may flow out of the dielectric body 130 through openings 113 in the housing 110. The openings 112 and 113 may be aligned with vertically oriented holes (not shown in FIG. 1).

Figure 2A:
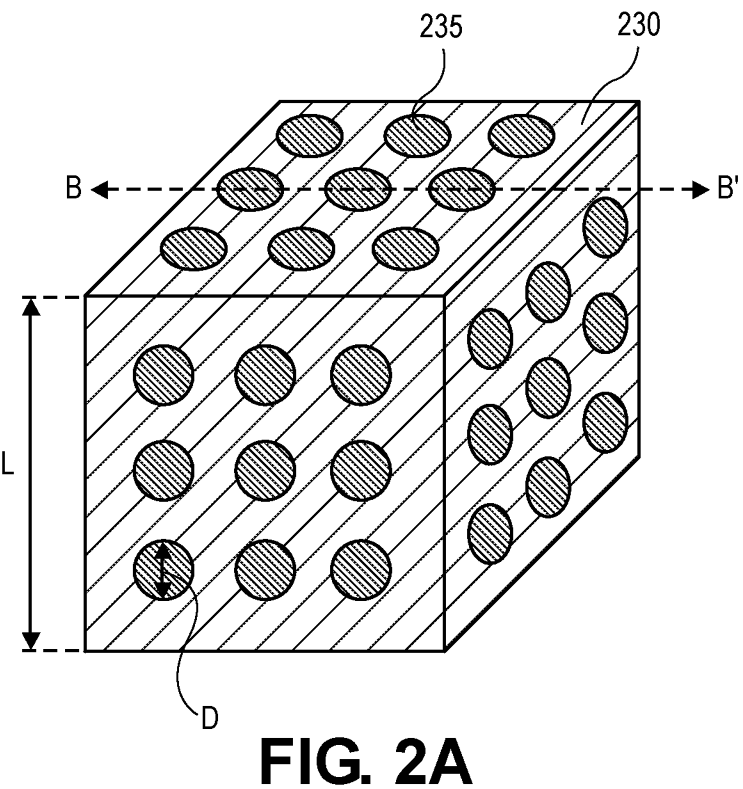
FIG. 2A is a perspective view of the dielectric body of a plasma source, in accordance with an embodiment.

Referring now to FIG. 2A, a perspective view illustration of the dielectric body 230 is shown, in accordance with an embodiment. In an embodiment, the dielectric body 230 may be a cube. That is, each edge of the dielectric body 230 may have a substantially uniform length L. In other embodiments, the dielectric body may be a rectangular prism (i.e., not all edges have the same length L). In the case of a 2.45 GHz microwave, the length L may be approximately 3 cm.

As shown, holes 135 are provided along all surfaces of the dielectric body 230. The holes 135 may have a diameter that is approximately 2 mm or smaller. In an embodiment, the same number of holes 135 are provided along each surface of the dielectric body 230. For example, in the illustrated embodiment, nine holes are provided along each of the faces of the dielectric body 230. In other embodiments, different numbers of holes may be provided on different faces. For example the top and bottom surface may comprise nine holes 235, and the sidewalls may comprise four holes. As will be described in greater detail below, the holes 235 may intersect each other within the dielectric body 230.

Figure 2B:
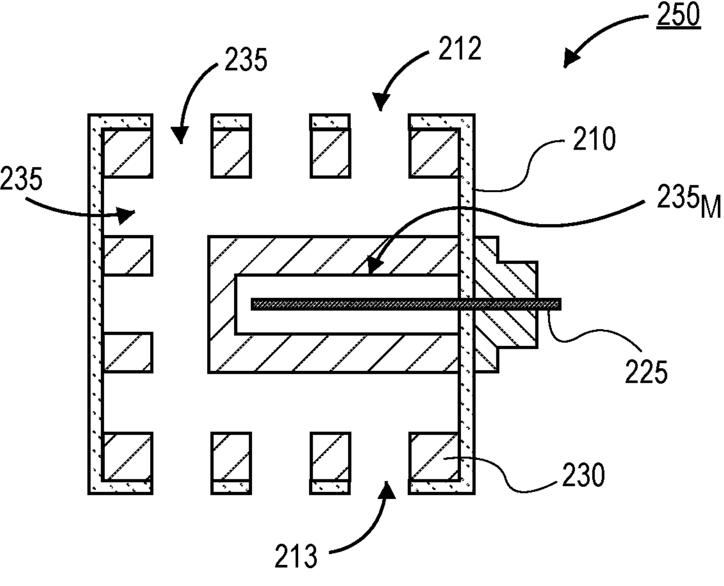
FIG. 2B is a cross-sectional illustration of the plasma source that illustrates the intersecting holes and the isolated hole for the monopole antenna, in accordance with an embodiment.

Referring now to FIG. 2B, a cross-sectional illustration of the plasma source 250 is shown, in accordance with an embodiment. As shown, a housing 210 surrounds the dielectric body 230. Holes 235 may be provided through the dielectric body 230. As shown, the vertical holes may intersect the horizontal holes at a substantially orthogonal angle. However, it is to be appreciated that a middle hole 235M is not intersected by other holes 235. The middle hole 235M may be used to house the monopole antenna 225. The monopole antenna 225 may also pass through the housing 210 to a coaxial connector on the outside of the plasma source 250. Providing a dedicated hole 235M allows for the monopole antenna 225 to be inserted into the dielectric body 230 without also exposing the monopole antenna 225 to the processing gasses. In an embodiment, the antenna 225 is typically at atmospheric pressure, and there is no plasma in the hole 235M containing the antenna 225.

Figure 2C:
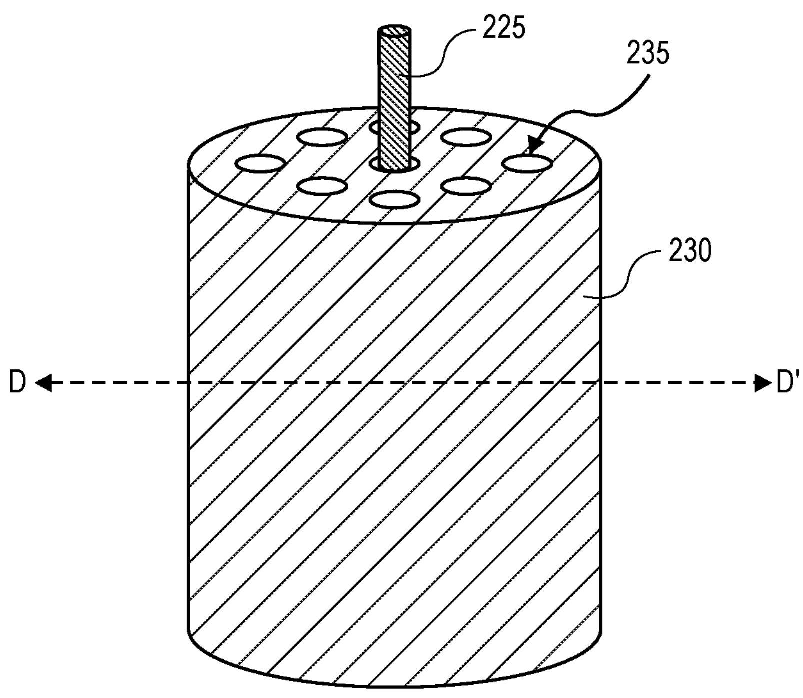
FIG. 2C is a perspective view of a dielectric body of a plasma source, where the dielectric body is cylindrical, in accordance with an embodiment.

Referring now to FIG. 2C, a perspective view illustration of a cylindrical dielectric body 230 is shown, in accordance with an embodiment. In an embodiment, the holes 235 may extend from a top surface of the dielectric body 230 to a bottom surface of the dielectric body 230. The holes 235 may be arranged in a circular pattern, as shown in FIG. 2C. Of course, it is to be appreciated that any pattern of the holes may be used. In an embodiment, a central hole may be filled by the monopole antenna 225. The monopole antenna 225 may extend down a radial center of the dielectric body 230.

Figure 2D:
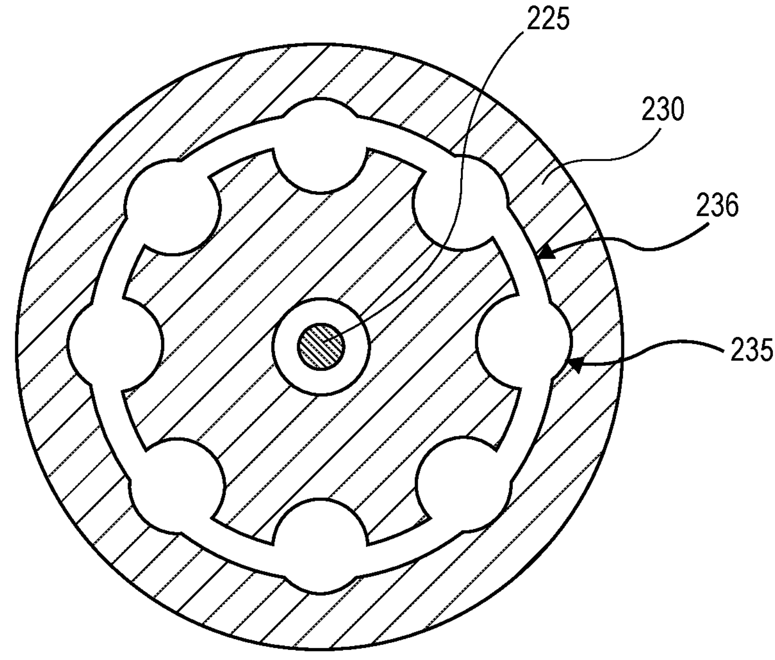
FIG. 2D is a cross-section of the dielectric body in FIG. 2C, in accordance with an embodiment.

Referring now to FIG. 2D, a cross-sectional illustration of the dielectric body 230 is shown, in accordance with an embodiment. As shown, the holes 235 may be fluidically connected by a ring 236. While a substantially circular ring 236 is shown, it is to be appreciated that any type of channel within the dielectric body 230 may fluidically couple two or more of the holes 235 together. As shown, the central hole 235 for the monopole antenna 225 may not be fluidically coupled to the other holes 235. As such, the monopole antenna 225 may be isolated from gasses and plasma in the dielectric body 230. In an embodiment, there may be multiple circular rings 236 along the vertical axis of the dielectric body 230 at various heights.

Figure 3:
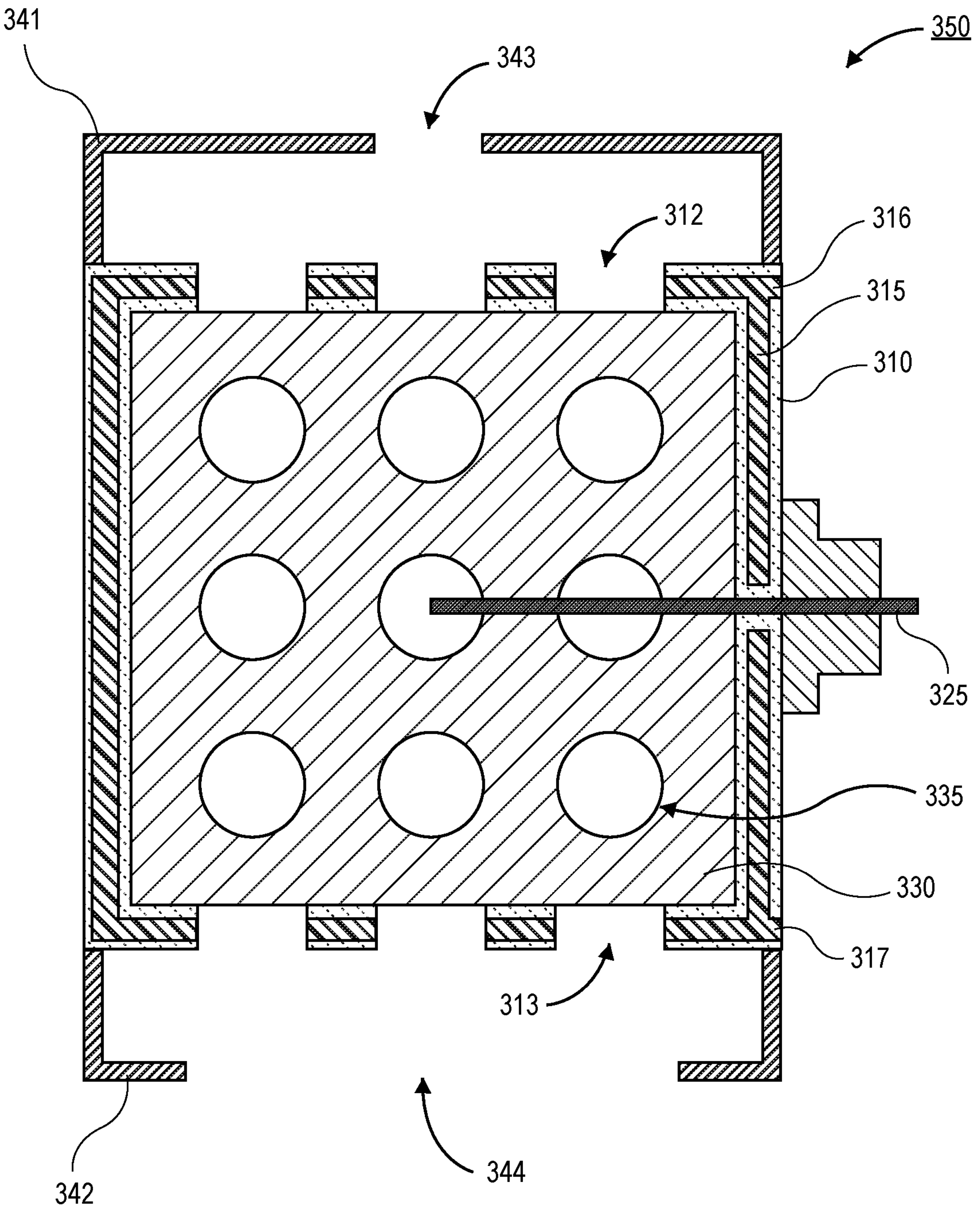
FIG. 3 is a front view illustration of a plasma source with a dielectric body and cooling channels through the outer housing, in accordance with an embodiment.

Referring now to FIG. 3, a cross-sectional illustration of a plasma source 350 is shown, in accordance with an additional embodiment. The plasma source 350 may be substantially similar to the plasma source 150 in FIG. 1, with the exception of the fabrication of the housing 310. That is, the plasma source 350 may comprise a dielectric body 330 with holes 335. A first chamber 341 feeds gas from an opening 343 to openings 312 in the housing 310, and, ultimately, into the dielectric body 330. Openings 313 in the housing allow for dissociated gas to travel into the second chamber 342 and, ultimately, to a processing chamber through opening 344. A monopole antenna 325 may be inserted into the dielectric body 330. While shown as intersecting holes 335, it is to be appreciated that the monopole antenna 325 may be substantially isolated from all processing gases, similar to the embodiment shown in FIG. 2B.

In an embodiment, the housing 310 in FIG. 3 may further comprise cooling channels 315. The cooling channels 315 may be coupled to an inlet 316 and an outlet 317. The inlet 316 and the outlet 317 may be coupled to process cooling water (PCW). As such, a dedicated cooling source may not be needed for the housing 310. In other embodiments, cooling fluids other than water may be used to cool the housing 310.

Figure 4:
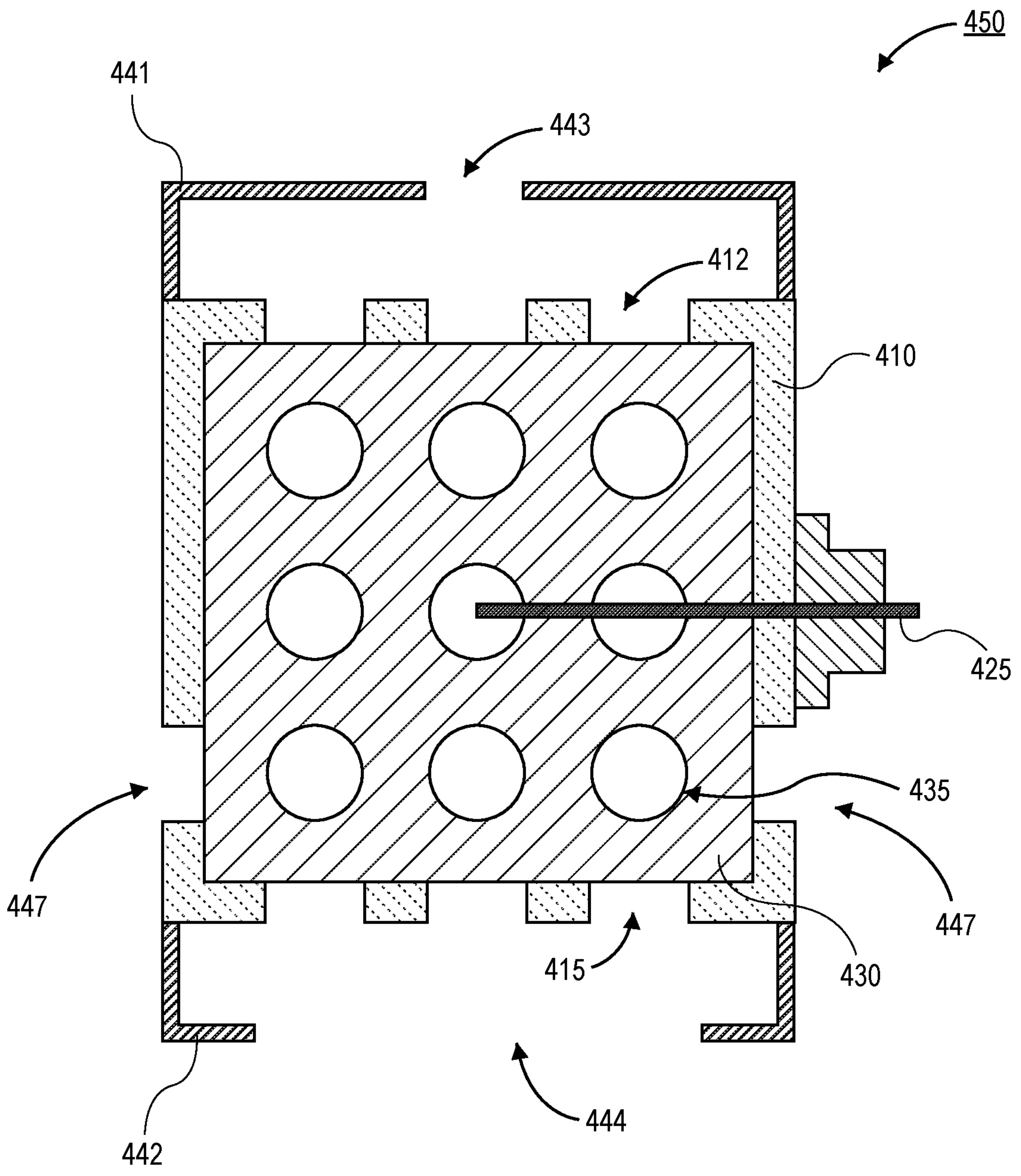
FIG. 4 is a front view illustration of a plasma source with a dielectric body and windows through the outer housing for observing the plasma, in accordance with an embodiment.

Referring now to FIG. 4, a cross-sectional illustration of a plasma source 450 is shown, in accordance with an additional embodiment. The plasma source 450 may be substantially similar to the plasma source 150 in FIG. 1, with the exception of the addition of plasma windows 447 through the housing 410. That is, the plasma source 450 may comprise a dielectric body 430 with holes 435. A first chamber 441 feeds gas from an opening 443 to openings 412 in the housing 410, and, ultimately, into the dielectric body 430. Openings 413 in the housing allow for dissociated gas to travel into the second chamber 442 and, ultimately, to a processing chamber through opening 444. A monopole antenna 425 may be inserted into the dielectric body 430. While shown as intersecting holes 435, it is to be appreciated that the monopole antenna 425 may be substantially isolated from all processing gases, similar to the embodiment shown in FIG. 2B.

In an embodiment, the plasma windows 447 provide a port through the housing 410 that can be used to observe the plasma within the dielectric body 430. For example, the plasma windows 447 may be aligned with holes (e.g., side holes in FIG. 4). While shown as a gap in the housing 410, an optically clear covering may seal the housing 410 at the plasma windows 447, in accordance with an embodiment. In the illustrated embodiment, a pair of plasma windows 447 are shown. In other embodiments, a single plasma window 447 is provided. In yet another embodiment, more than two plasma windows 447 may be provided.

Figure 5:
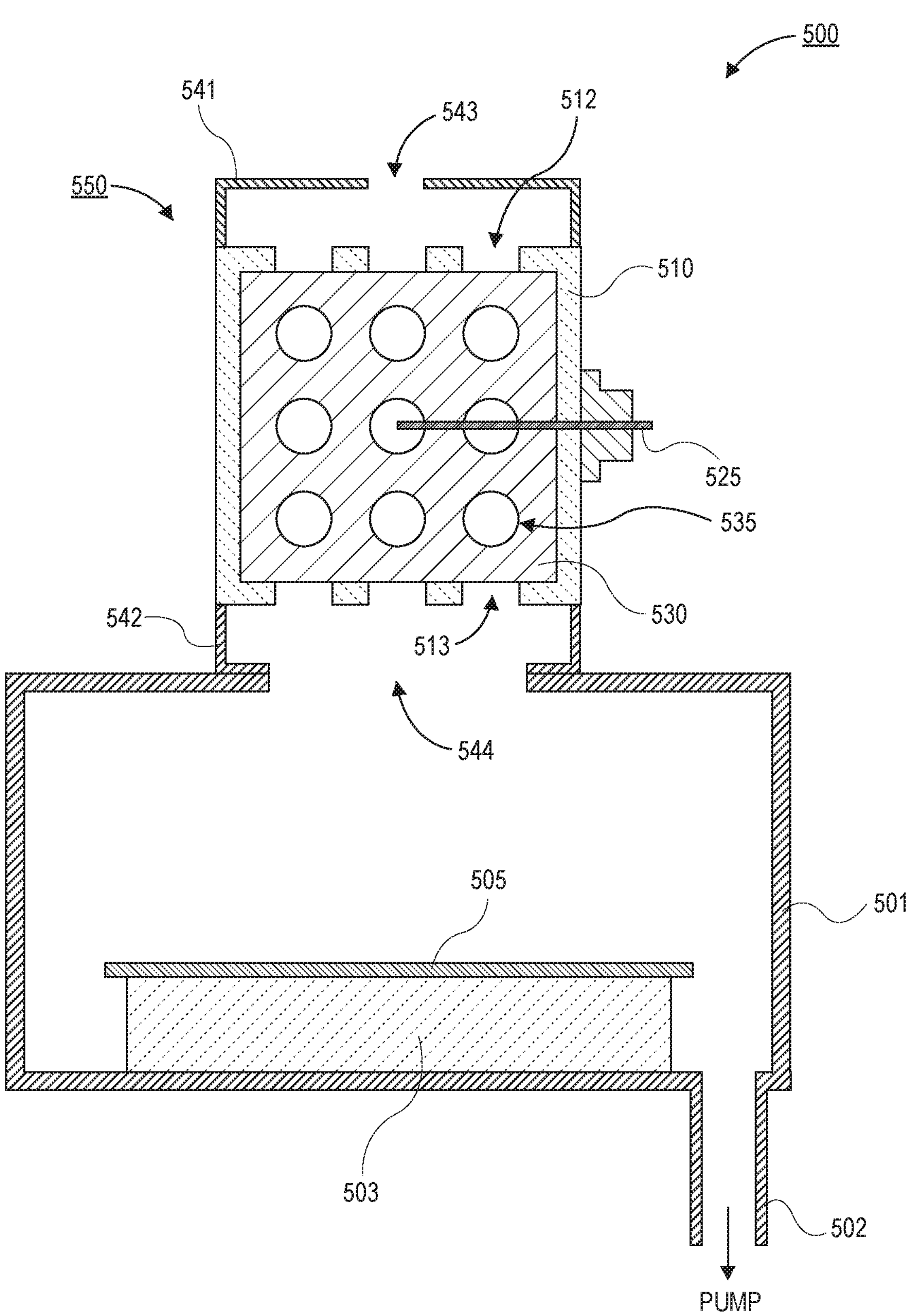
FIG. 5 is a cross-sectional illustration of a plasma processing tool that includes a remote plasma source with a dielectric body with holes through the dielectric body, in accordance with an embodiment.

Referring now to FIG. 5, a cross-sectional illustration of a processing tool 500 is shown, in accordance with an embodiment. In an embodiment, the processing tool 500 may be a material deposition tool, such as a chemical vapor deposition (CVD) tool, and atomic layer deposition (ALD) tool, a physical vapor deposition (PVD) tool, or the like. Though it is to be appreciated that embodiments disclosed herein are not limited to deposition tools. For example, the plasma source described herein may optionally be used in etching chambers (e.g., material removal), plasma treatment chambers, or any other plasma chamber typical of semiconductor manufacturing environments.

The processing tool 500 may comprise a processing chamber 501. The processing chamber 501 may comprise a pedestal 503, chuck, or the like for supporting and securing a substrate 505 during processing. The substrate 505 may be a wafer, such as a silicon wafer or other semiconductor wafer. Though, it is to be appreciated that the substrate 505 may also be other substrates, such as glass substrates, organic substrates, or the like. In an embodiment, the processing chamber 501 may be configured to be operated at a sub-atmospheric pressure. For example, the processing chamber 501 may be fluidically coupled to an exhaust 502 that is controlled by a pump. Over the course of processing substrates 505 in the processing chamber 501, the interior surfaces of the processing chamber 501 may be coated with deposition material (in the case of a deposition process) or by etching byproducts (in the case of an etching process). In order to maintain proper processing conditions with the processing chamber 501, the interior surfaces need to be periodically cleaned. In an embodiment, the cleaning process may be implemented through the use of a remote plasma.

In an embodiment, the processing tool 500 may comprise a remote plasma source 550. The remote plasma source 550 may be provided above the processing chamber 501. Due to the compact design of the remote plasma source 550, integration with existing processing chambers 501 is simplified. In an embodiment, the remote plasma source 550 may be fed processing gasses into an opening 543 from a gas source (not shown). In the particular embodiment of a plasma cleaning operation, the gas may comprise $NF_3$. Though it is to be appreciated that other gasses may also be used in accordance with various embodiments.

The plasma source 550 shown in FIG. 5 may be substantially similar to the plasma source 150 in FIG. 1. That is, the plasma source 550 may comprise a dielectric body 530 with holes 535. A first chamber 541 feeds gas from an opening 543 to openings 512 in the housing 510, and, ultimately, into the dielectric body 5330. Openings 513 in the housing allow for dissociated gas to travel into the second chamber 5342 and, ultimately, to a processing chamber through opening 544. A monopole antenna 525 may be inserted into the dielectric body 530. While shown as intersecting holes 535, it is to be appreciated that the monopole antenna 525 may be substantially isolated from all processing gases, similar to the embodiment shown in FIG. 2B.

While shown as being substantially similar to the plasma source in FIG. 1, it is to be appreciated that the plasma source 550 may be similar to any of the embodiments described herein. For example, the plasma source 550 may further comprise a housing 510 with cooling channels that are coupled to the tool PCW, as shown in FIG. 3. Additionally, plasma windows may be formed through the housing 510 in order to observe the plasma within the dielectric body 530.

Figure 6:
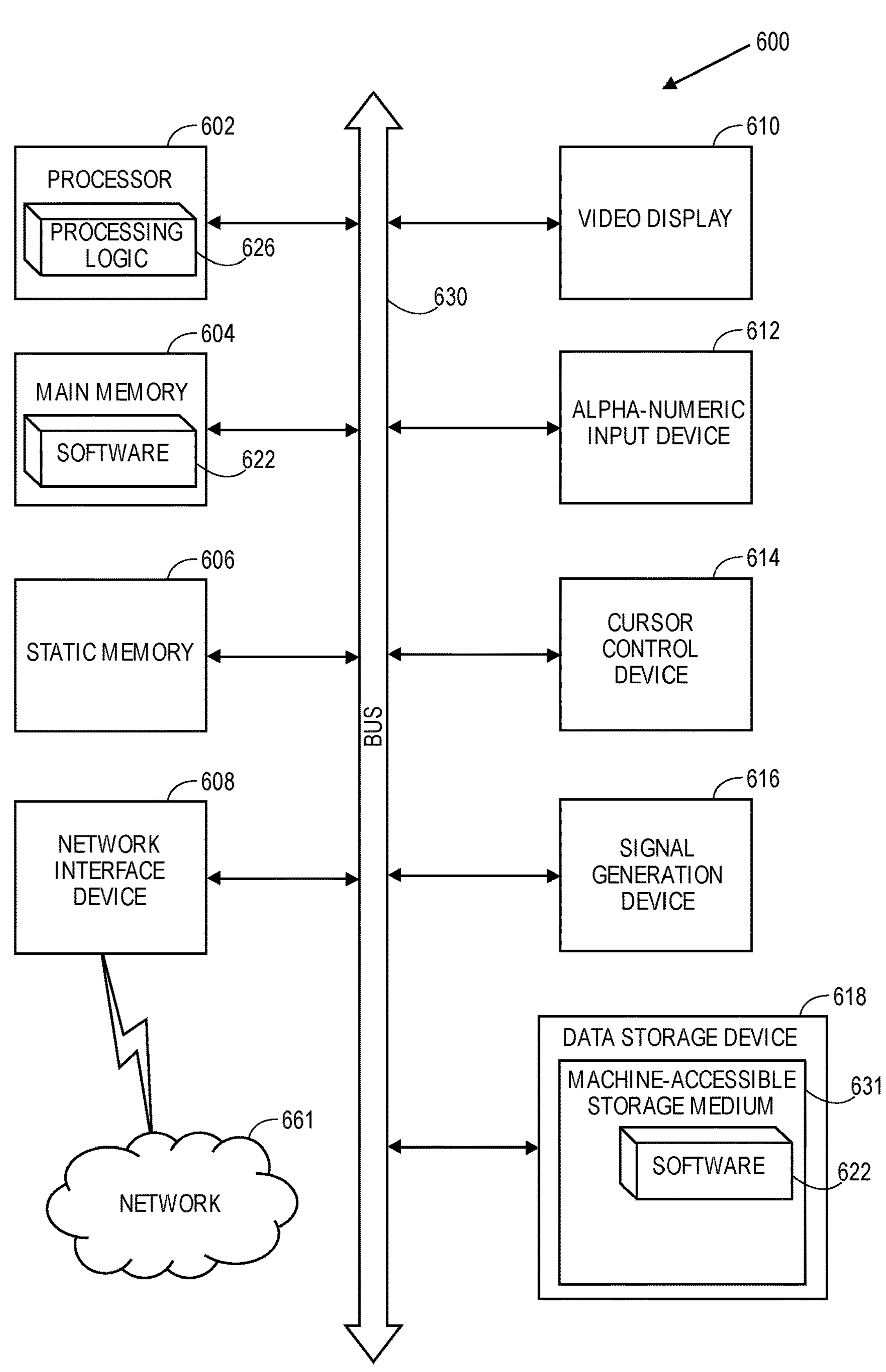
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of cleaning a processing chamber using a remote plasma source with a dielectric body with a plurality of holes and a grounded housing.

Thus, methods for chamber cleaning with a remote plasma have been disclosed.

What is claimed is:

1. A plasma source, comprising:

a dielectric body with a top surface, a bottom surface, and first and second sidewall surfaces, the first sidewall surface laterally opposite the second sidewall surface;

a plurality of holes through the dielectric body, wherein a first set of holes pass from the top surface to the bottom surface, and a second set of holes pass from the first sidewall surface to the second sidewall surface;

a housing around the dielectric body; and a monopole antenna having an end extending into but not entirely through the dielectric body, the end separated from the dielectric body by an antenna hole.

2. The plasma source of claim 1, wherein the first set of holes intersect the second set of holes.

3. The plasma source of claim 1, wherein the housing is grounded.

4. The plasma source of claim 1, wherein openings are formed through the housing above and below the dielectric body, wherein the openings are aligned with the first set of holes.

5. The plasma source of claim 1, wherein diameters of individual ones of the holes is approximately 2 mm or smaller.

6. The plasma source of claim 1, further comprising:

cooling channels through the housing.

7. The plasma source of claim 1, wherein the dielectric body is a cube.

8. The plasma source of claim 7, wherein each edge of the cube has a length of approximately 3 cm.

9. The plasma source of claim 1, wherein the dielectric body is alumina.

10. The plasma source of claim 1, wherein the monopole antenna extends into the dielectric body through a hole that does not intersect with any other holes.

11. The plasma source of claim 1, further comprising:

a window through the housing.

12. The plasma source of claim 1, further comprising:

a gas inlet above the housing; and a gas outlet below the housing.

13. A plasma processing tool, comprising:

a chamber, wherein the chamber is fluidically coupled to a pump that is configured to provide a sub-atmospheric pressure in the chamber; and a plasma source coupled to the chamber, wherein the plasma source comprises:

a dielectric body with a top surface, a bottom surface, and first and second sidewall surfaces, the first sidewall surface laterally opposite the second sidewall surface;

a plurality of holes through the dielectric body, wherein a first set of holes pass from the top surface to the bottom surface, and a second set of holes pass from the first sidewall surface to the second sidewall surface;

a housing around the dielectric body; and a monopole antenna having an end extending into but not entirely through the dielectric body, the end separated from the dielectric body by an antenna hole.

14. The plasma processing tool of claim 13, further comprising:

a gas inlet to feed gas into the first set of holes; and a gas outlet between a bottom of the first set of holes and the chamber.

15. The plasma processing tool of claim 13, wherein the plasma source is a remote plasma source.

16. The plasma processing tool of claim 13, wherein diameters of individual ones of the plurality of holes is approximately 2 mm or smaller.

17. The plasma processing tool of claim 13, wherein the dielectric body is a cube, and wherein edges of the cube have a length that is approximately 3 cm or less.

18. A plasma processing tool, comprising:

a chamber, wherein the chamber is fluidically coupled to a pump configured to provide a sub-atmospheric pressure in the chamber; and a remote plasma source coupled to the chamber, wherein the remote plasma source comprises:

a dielectric body having a first sidewall surface laterally opposite a second sidewall surface;

a plurality of holes passing through the dielectric body, wherein two or more of the plurality of holes intersect each other at a substantially orthogonal angle, and wherein one or more of the plurality of holes pass from the first sidewall surface to the second sidewall surface, and a monopole antenna having an end extending into but not entirely through the dielectric body through an antenna hole, the end separated from the dielectric body by the antenna hole, wherein the antenna hole does not intersect any of the plurality of holes.

19. The plasma processing tool of claim 18, further comprising:

a grounded housing surrounding the dielectric body.

20. The plasma processing tool of claim 18, wherein individual ones of the plurality of holes have diameters that are approximately 2 mm or smaller.

* * * * *